(12) United States Patent
Taniguchi

(10) Patent No.: US 8,896,394 B2
(45) Date of Patent: Nov. 25, 2014

(54) ELECTRONIC COMPONENT

(71) Applicant: Murata Manufacturing Co., Ltd., Nagaokakyo (JP)

(72) Inventor: Tetsuo Taniguchi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/969,766

(22) Filed: Aug. 19, 2013

(65) Prior Publication Data

US 2013/0335159 A1    Dec. 19, 2013

Related U.S. Application Data

(63) Continuation of application No. PCT/JP2012/053846, filed on Feb. 17, 2012.

(30) Foreign Application Priority Data

Mar. 18, 2011 (JP) ................. 2011-060267

(51) Int. Cl.
| | |
|---|---|
| *H03H 7/42* | (2006.01) |
| *H03H 7/01* | (2006.01) |
| *H03H 7/09* | (2006.01) |
| *H03H 1/00* | (2006.01) |

(52) U.S. Cl.
CPC ......... *H03H 7/42* (2013.01); *H03H 2001/0085* (2013.01); *H03H 7/1775* (2013.01); *H03H 7/09* (2013.01); *H03H 7/0115* (2013.01)
USPC ............................................. 333/185; 333/25

(58) Field of Classification Search
CPC .................... H03H 2001/0085; H03H 7/0115; H03H 7/42; H03H 7/09
USPC .................................................. 333/25, 185
See application file for complete search history.

(56) References Cited

U.S. PATENT DOCUMENTS

| | | | |
|---|---|---|---|
| 8,183,956 B2 * | 5/2012 | Hayashi et al. | ............... 333/132 |
| 2002/0171510 A1 | 11/2002 | Kushitani et al. | |

(Continued)

FOREIGN PATENT DOCUMENTS

| | | |
|---|---|---|
| JP | 7-38368 A | 2/1995 |
| JP | 10-190391 A | 7/1998 |

(Continued)

OTHER PUBLICATIONS

Official Communication issued in International Patent Application No. PCT/JP2012/053846, mailed on Apr. 3, 2012.

(Continued)

*Primary Examiner* — Benny Lee
*Assistant Examiner* — Rakesh Patel
(74) *Attorney, Agent, or Firm* — Keating & Bennett, LLP

(57) ABSTRACT

An electronic component includes a laminate including a plurality of insulator layers and a mounting surface. The mounting surface is defined by the outer edges of the plurality of insulator layers that are continuously joined together. An LC parallel resonator is embedded in the laminate, and includes a coil and a capacitor. An unbalanced signal is inputted to the LC parallel resonator. A coil is embedded in the laminate. The coil is electromagnetically coupled to the coil, and outputs balanced signals. Outer electrodes are provided on the mounting surface, and are grounded. A ground conductor layer of the capacitor is connected to an outer electrode by extending to the mounting surface.

19 Claims, 12 Drawing Sheets

(56) References Cited

U.S. PATENT DOCUMENTS

| | | | |
|---|---|---|---|
| 2004/0164817 A1* | 8/2004 | Nosaka | 333/25 |
| 2011/0169586 A1 | 7/2011 | Taniguchi | |
| 2012/0249264 A1* | 10/2012 | Wakata et al. | 333/185 |

FOREIGN PATENT DOCUMENTS

| | | |
|---|---|---|
| JP | 11-283833 A | 10/1999 |
| JP | 2002-217616 A | 8/2002 |
| JP | 2002-261561 A | 9/2002 |
| JP | 2003-17968 A | 1/2003 |
| JP | 2004-274715 A | 9/2004 |
| JP | 2004-320561 A | 11/2004 |
| JP | 2009-246889 A | 10/2009 |
| JP | 4525864 B2 | 8/2010 |

OTHER PUBLICATIONS

Official Communication issued in corresponding Japanese Patent Application No. 2013-505847, mailed on Sep. 24, 2014.

* cited by examiner

ELECTRONIC COMPONENT

BACKGROUND OF THE INVENTION

1. Field of the Invention

The present invention relates to an electronic component. More specifically, the present invention relates to an electronic component that converts an unbalanced signal into a balanced signal.

2. Description of the Related Art

As electronic components according to related art, for example, a multilayer balance filter described in Japanese Patent No. 4525864 is known. Hereinafter, the multilayer balance filter described in Japanese Patent No. 4525864 will be described with reference to the drawings. FIG. 15 is an equivalent circuit diagram of a multilayer balance filter 500 described in Japanese Patent No. 4525864. FIG. 16 is a perspective view of the outward appearance of the multilayer balance filter 500 described in Japanese Patent No. 4525864. FIG. 17 is an exploded perspective view of the multilayer balance filter described in Japanese Patent No. 4525864.

As illustrated in FIG. 15, as its circuit configuration, the multilayer balance filter 500 includes coils L11 and L12, capacitors C11 to C13, an input port P11, and output ports P12 and P13. The coil L11 and the capacitor C11 form an LC parallel resonator. The coil L11 and the coil L12 are electromagnetically coupled to each other. The input port P11 is connected to the coil L11, and the output ports P12 and P13 are connected to the coil L12. The capacitors C12 and C13 are connected between the coil L12, and the output ports P12 and P13, respectively, and are grounded. In the multilayer balance filter 500 mentioned above, an unbalanced signal is inputted from the input port P11, and balanced signals are outputted from the output ports P12 and P13.

As illustrated in FIGS. 16 and 17, the multilayer balance filter 500 mentioned above is formed by a laminated electronic component. More specifically, the multilayer balance filter 500 includes a laminate 508, outer electrodes 509 (509a to 509f), linear electrodes 512 (512a to 512d), capacitor electrodes 514 (514a to 514d), and via hole conductors V101 to V105.

As illustrated in FIG. 17, the laminate 508 includes insulator layers 510a to 510f that are laminated so as to be arranged in this order from the upper side to the lower side of the laminating direction. The outer electrodes 509a to 509c are provided on one side surface of the laminate 508, and the outer electrodes 509d to 509f are provided on the other side surface of the laminate 508. The outer electrode 509a is the input port P11, and the outer electrodes 509d and 509f are the output ports P12 and P13, respectively.

The capacitor C11 includes capacitor electrodes 514a and 514b. The coil L11 includes the linear conductor 512b and the via hole conductors V103 to V105 that are connected in series. The coil L12 includes linear conductors 512a, 512c, and 512d and the via hole conductors V101 and V102 which are connected in series. The capacitor C12 includes the capacitor electrodes 514b and 514c. The capacitor C13 includes the capacitor electrodes 514b and 514d.

When the multilayer balance filter 500 configured as mentioned above is mounted onto a circuit board, the lower surface of the laminate 508 is opposed to the circuit board. That is, the lower surface of the laminate 508 serves as a mounting surface.

Incidentally, the multilayer balance filter 500 described in Japanese Patent No. 4525864 functions as a band pass filter that passes high-frequency signals within a predetermined band. However, the multilayer balance filter 500 has a problem in that high-frequency signals with frequencies higher than the predetermined band are outputted from the output ports P12 and P13.

More specifically, the mounting surface of the multilayer balance filter 500 is the lower surface of the laminate 508. Therefore, the coil L11 and the capacitor C11 are connected to the circuit board via the outer electrode 509e provided on a side surface of the laminate 508. Consequently, an electric current path formed by the outer electrode 509e extending in the laminating direction is formed between each of the coil L11 and the capacitor C11, and the circuit board. A parasitic inductance is created in such an electric current path. Since a parasitic inductance blocks high-frequency signals with high frequencies from passing through, the parasitic inductance blocks high-frequency signals with frequencies higher than a predetermined band from flowing to the ground side. As a result, high-frequency signals having frequencies higher than the predetermined band are not removed, leading to deterioration of the out-of-band attenuation characteristics of the multilayer balance filter at frequencies higher than the predetermined band.

SUMMARY OF THE INVENTION

Preferred embodiments of the present invention provide an electronic component that prevents deterioration of the out-of-band attenuation characteristics at frequencies higher than a predetermined band.

An electronic component according to a preferred embodiment of the present invention includes a laminate that includes a plurality of insulator layers that are laminated, the laminate including a mounting surface, the mounting surface being defined by outer edges of the plurality of insulator layers that are continuously joined together, an LC parallel resonator to which an unbalanced signal is inputted, the LC parallel resonator being embedded in the laminate and including a first coil and a first capacitor, a second coil that is embedded in the laminate, the second coil being electromagnetically coupled to the first coil and outputting a balanced signal, and a first outer electrode that is provided on the mounting surface, and is grounded. A ground conductor layer of the first capacitor is connected to the first outer electrode by extending to the mounting surface.

Preferred embodiments of the present invention make it possible to prevent deterioration of the out-of-band attenuation characteristics at frequencies higher than a predetermined band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
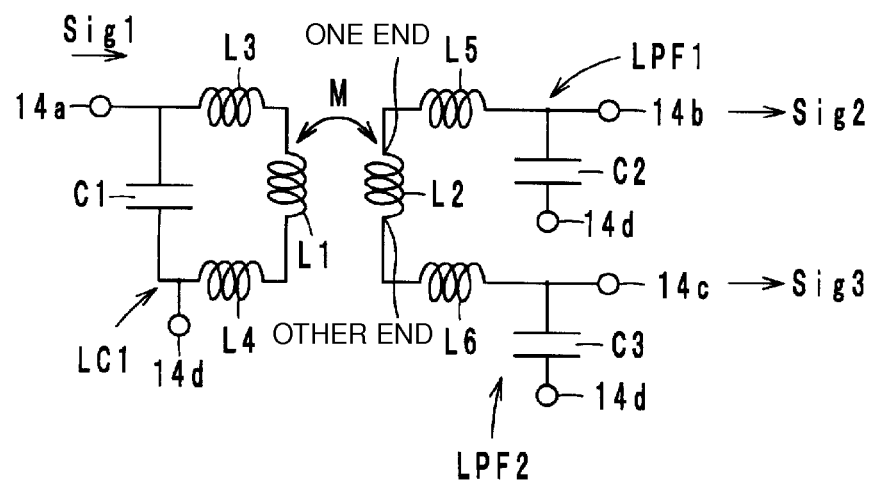
FIG. 1 is an equivalent circuit diagram of an electronic component according to a preferred embodiment of the present invention.

Hereinafter, the configuration of an electronic component according to various preferred embodiments of the present invention will be described with reference to the drawings.
First Preferred Embodiment Hereinafter, the circuit configuration of an electronic component according to a first preferred embodiment of the present invention will be described with reference to the drawings. The electronic component according to the first preferred embodiment is preferably a balance filter. A balance filter is an element used in, for example, the tuner of a cellular phone to convert an unbalanced signal received by an antenna into a balanced signal and output the balanced signal to a high-frequency IC on the downstream side. FIG. 1 is an equivalent circuit diagram of an electronic component $10a$ according to the first preferred embodiment.

As illustrated in FIG. 1, as its circuit configuration, the electronic component $10a$ preferably includes outer electrodes 14 (14$a$ to 14$e$ (the outer electrode 14$e$ is omitted in FIG. 1)), an LC parallel resonator LC1, a coil L2, and low pass filters LPF1 and LPF2.

The LC parallel resonator LC1 preferably includes coils L1, L3, and L4, and a capacitor C1. The coils L3, L1, and L4 are connected in series between the outer electrodes 14$a$ and 14$d$ so as to be arranged in this order. The capacitor C1 is preferably connected in parallel to the coils L3, L1, and L4, between the outer electrodes 14$a$ and 14$d$.

The coil L2 is electromagnetically coupled to the coil L1. The low pass filter LPF1 is preferably connected between one end of the coil L2 and the outer electrode 14$b$. The low pass filter LPF1 is preferably an L-type low pass filter including a coil L5 and a capacitor C2. That is, the coil L5 is connected between one end of the coil L2 and the outer electrode 14$b$. The capacitor C2 is connected between a portion between the coil L5 and the outer electrode 14$b$, and the outer electrode 14$d$. The low pass filter LPF1 provides impedance matching between the coil L2 and an external apparatus connected to the outer electrode 14$b$. Therefore, the one end of the coil L2 is connected to the outer electrode 14$b$ via the low pass filter LPF1.

The low pass filter LPF2 is preferably connected between the other end of the coil L2 and the outer electrode 14$c$. The low pass filter LPF2 is preferably an L-type low pass filter including a coil L6 and a capacitor C3. That is, the coil L6 is connected between the other end of the coil L2 and the outer electrode 14$c$. The capacitor C3 is connected between a portion between the coil L6 and the outer electrode 14$c$, and the outer electrode 14$d$. The low pass filter LPF2 provides impedance matching between the coil L2 and an external apparatus connected to the outer electrode 14$c$. Therefore, the other end of the coil L2 is connected to the outer electrode 14$c$ via the low pass filter LPF2.

In the electronic component $10a$ configured as mentioned above, the outer electrode 14$d$ is grounded, the outer electrode 14$a$ serves as an input terminal (unbalanced terminal), and the outer electrodes 14$b$ and 14$c$ serve as output terminals (balanced terminals). Thus, the electronic component $10a$ is preferably used as a balance filter. When an unbalanced signal (signal Sig1) is inputted to the LC parallel resonator LC1 via the outer electrode 14$a$, an unbalanced signal (signal Sig1) with a frequency corresponding to the characteristics of the LC parallel resonator LC1 flows between the outer electrodes 14$a$ and 14$d$. At this time, the unbalanced signal (Sig1) is converted into balanced signals (signals Sig2 and Sig3) owing to electromagnetic induction between the coil L1 and the coil L2. The balanced signals (signals Sig2 and Sig3) are outputted to the outer electrodes 14$b$ and 14$c$ from one end and the other end of the coil L2, respectively. Consequently, the balanced signals (signals Sig2 and Sig3) are outputted from the outer electrodes 14$b$ and 14$c$.

Figure 2:
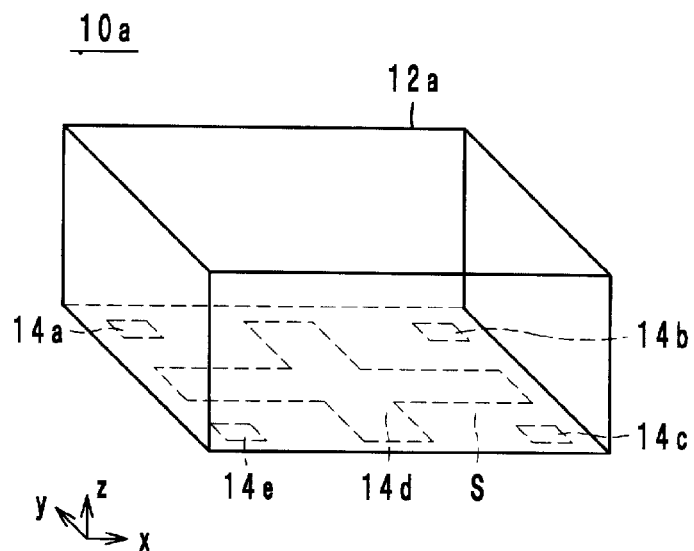
FIG. 2 is a perspective view of the outward appearance of the electronic component illustrated in FIG. 1.
Figure 3:
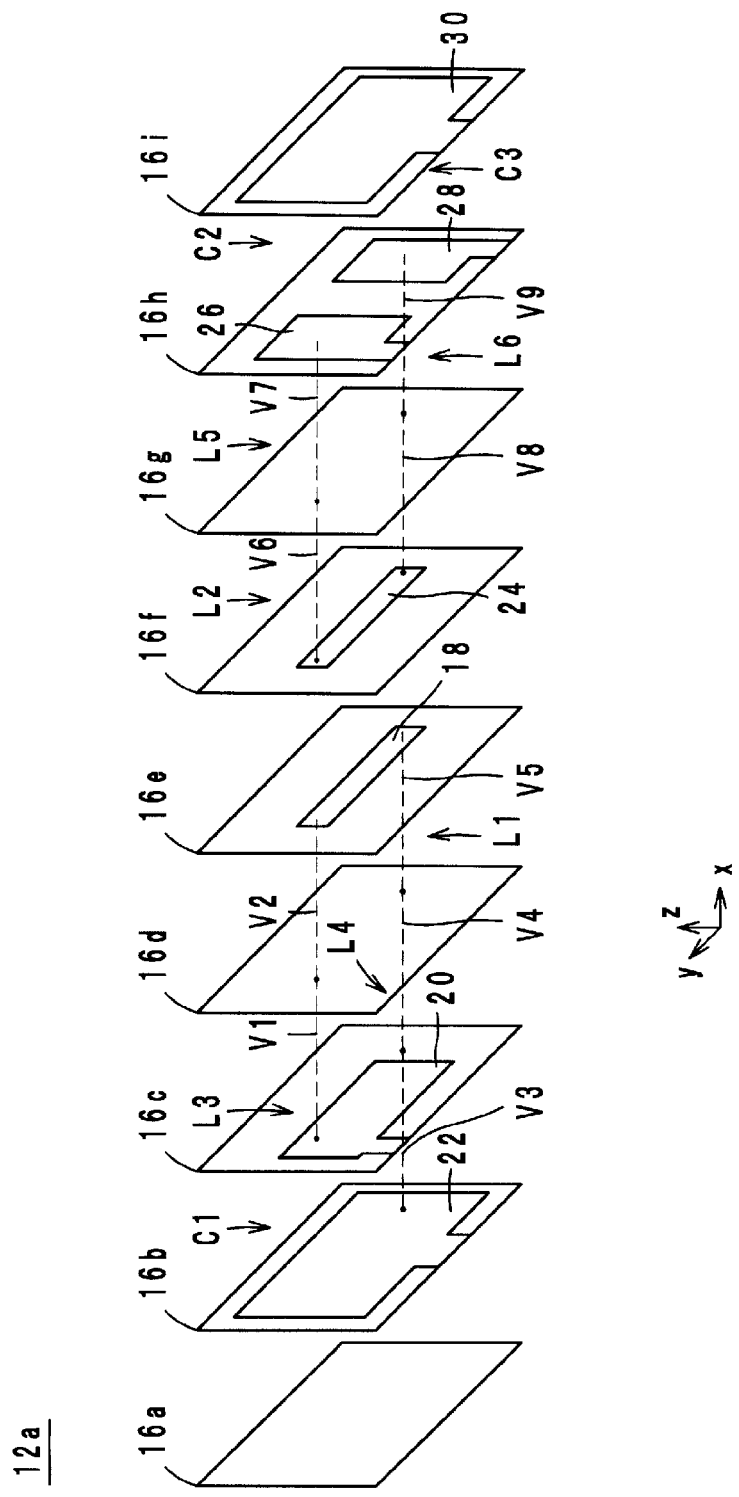
FIG. 3 is an exploded perspective view of a laminate of the electronic component illustrated in FIG. 2.

Next, the configuration of an electronic component $10a$ will be described with reference to the drawings. FIG. 2 is a perspective view of the outward appearance of the electronic component $10a$ illustrated in FIG. 1. FIG. 3 is an exploded perspective view of a laminate $12a$ of the electronic component $10a$ illustrated in FIG. 2. Hereinafter, the laminating direction of the electronic component $10a$ is defined as x-axis direction. The direction along the long side of the electronic component $10a$ when seen in plan view from the x-axis direction is defined as y-axis direction, and the direction along the short side of the electronic component $10a$ is defined as z-axis direction. The x-axis direction, the y-axis direction, and the z-axis direction are orthogonal to one another.

As illustrated in FIGS. 2 and 3, the electronic component $10a$ preferably includes the laminate $12a$, the outer electrodes 14 (14$a$ to 14$e$), coil conductor layers 18 and 24, capacitor conductor layers 20, 26, and 28, ground conductor layers 22 and 30, and via hole conductors V (V1 to V9).

The laminate $12a$ preferably includes insulator layers 16$a$ to 16$i$ that are laminated so as to be arranged in this order from the negative direction side to the positive direction side of the x-axis direction. The laminate $12a$ preferably has a rectangular or substantially rectangular parallelepiped shape. The dimensions of the laminate $12a$ are preferably, for example, approximately 1.6 mm×0.8 mm×0.5 mm. Each of the insulator layers 16 is a rectangular dielectric layer (for example, LTCC), and has a relative dielectric constant of 20, for example. As illustrated in FIG. 2, the laminate $12a$ includes a mounting surface S. The mounting surface S is preferably defined by the long sides (that is, the outer edges) on the negative direction side of the z-axis direction of the insulator layers 16a to 16i that are continuously joined together.

The outer electrodes 14 (14a to 14e) are preferably provided on the mounting surface S. The outer electrode 14a preferably has a rectangular or substantially rectangular shape. The outer electrode 14a is provided near the corner of the mounting surface S which is located on the negative direction side of the x-axis direction and the positive direction side of the y-axis direction. The outer electrode 14b preferably has a rectangular or substantially rectangular shape. The outer electrode 14b is provided near the corner of the mounting surface S which is located on the positive direction side of the x-axis direction and the positive direction side of the y-axis direction. The outer electrode 14c preferably has a rectangular or substantially rectangular shape. The outer electrode 14c is provided near the corner of the mounting surface S which is located on the positive direction side of the x-axis direction and the negative direction side of the y-axis direction. The outer electrode 14e preferably has a rectangular or substantially rectangular shape. The outer electrode 14e is provided near the corner of the mounting surface S which is located on the negative direction side of the x-axis direction and the negative direction side of the y-axis direction. The outer electrode 14d preferably has a cross shape. Specifically, the outer electrode 14d preferably includes a straight-line portion extending in the x-axis direction and a straight-line portion extending in the y-axis direction. The two straight-line portion cross each other at the intersection of the diagonals of the mounting surface S. Consequently, the outer electrode 14d is arranged between the outer electrodes 14a, 14b, 14c, and 14e.

The capacitor C1 is preferably embedded in the laminate 12a. The capacitor C1 includes the capacitor conductor layer 20 and the ground conductor layer 22. The capacitor conductor layer 20 is a conductor layer that is provided on the insulator layer 16c and has a rectangular or substantially rectangular shape. The capacitor conductor layer 20 is connected to the outer electrode 14a by extending to the mounting surface S. The capacitor conductor layer 20 is preferably defined by, for example, a coating of a conductive material such as Cu.

The ground conductor layer 22 is preferably a conductor layer that is provided on the insulator layer 16b and has a rectangular or substantially rectangular shape. The ground conductor layer 22 is connected to the outer electrode 14d by extending to the mounting surface S. The ground conductor layer 22 is preferably defined by, for example, a coating of a conductive material such as Cu. The capacitor conductor layer 20 and the ground conductor layer 22 are opposed to each other with the insulator layer 16b therebetween. Thus, a capacitance is generated between the capacitor conductor layer 20 and the ground conductor layer 22. Consequently, the capacitor C1 is connected between the outer electrode 14a and the outer electrode 14d.

The coil L1 is preferably embedded in the laminate 12a. The coil L1 includes the coil conductor layer 18. The coil conductor layer 18 is preferably a linear conductor layer that is provided on the insulator layer 16e and extends in the y-axis direction. The coil conductor layer 18 is defined by, for example, a coating of a conductive material such as Cu.

The coil L3 is preferably embedded in the laminate 12a. The coil L3 includes the via hole conductors V1 and V2. The via hole conductors V1 and V2 penetrate the insulator layers 16c and 16d, respectively, in the x-axis direction. As the via hole conductors V1 and V2 are connected to each other, a single via hole conductor is formed. The via hole conductor V1 is preferably connected to the capacitor conductor layer 20, and the via hole conductor V2 is preferably connected to the coil conductor layer 18.

The coil L4 is preferably embedded in the laminate 12a. The coil L4 includes the via hole conductors V3, V4, and V5. The via hole conductors V3, V4, and V5 penetrate the insulator layers 16b, 16c, and 16d, respectively, in the x-axis direction. As the via hole conductors V3, V4, and V5 are connected to one another, a single via hole conductor is preferably defined. The via hole conductor V5 is connected to the coil conductor layer 18, and the via hole conductor V3 is connected to the ground conductor layer 22. Consequently, the coils L3, L1, and L4 are connected in parallel to the capacitor C1, between the outer electrode 14a and the outer electrode 14d. That is, the LC parallel resonator LC1 is connected between the outer electrodes 14a and 14d.

The capacitor C2 is preferably embedded in the laminate 12a. The capacitor C2 includes the capacitor conductor layer 26 and the ground conductor layer 30. The capacitor conductor layer 26 is a conductor layer that is provided on the insulator layer 16h and has a rectangular or substantially rectangular shape. The capacitor conductor layer 26 is connected to the outer electrode 14b by extending to the mounting surface S. The capacitor conductor layer 26 is preferably defined by, for example, a coating of a conductive material such as Cu.

The ground conductor layer 30 is preferably a conductor layer that is provided on the insulator layer 16i and has a rectangular or substantially rectangular shape. The ground conductor layer 30 is connected to the outer electrode 14d by extending to the mounting surface S. The ground conductor layer 30 is preferably defined by, for example, a coating of a conductive material such as Cu. The capacitor conductor layer 26 and the ground conductor layer 30 are opposed to each other with the insulator layer 16h therebetween. Thus, a capacitance is created between the capacitor conductor layer 26 and the ground conductor layer 30.

The coil L5 is preferably embedded in the laminate 12a. The coil L5 includes the via hole conductors V6 and V7. The via hole conductors V6 and V7 penetrate the insulator layers 16g and 16h, respectively, in the x-axis direction. As the via hole conductors V6 and V7 are connected to each other, a single via hole conductor is defined. The via hole conductor V7 is connected to the capacitor conductor layer 26. Consequently, the capacitor C2 is connected between a portion between the coil L5 and the outer electrode 14b, and the outer electrode 14d.

The capacitor C3 is preferably embedded in the laminate 12a. The capacitor C3 includes the capacitor conductor layer 28 and the ground conductor layer 30. The capacitor conductor layer 28 is a conductor layer that is provided on the insulator layer 16h and has a rectangular or substantially rectangular shape. The capacitor conductor layer 28 is connected to the outer electrode 14c by extending to the mounting surface S. The capacitor conductor layer 28 is preferably defined by, for example, a coating of a conductive material such as Cu.

The ground conductor layer 30 is preferably a conductor layer that is provided on the insulator layer 16i and has a rectangular or substantially rectangular shape. The ground conductor layer 30 is connected to the outer electrode 14d by extending to the mounting surface S. The ground conductor layer 30 is preferably defined by, for example, a coating of a conductive material such as Cu. The capacitor conductor layer 28 and the ground conductor layer 30 are opposed to each other with the insulator layer 16h therebetween. Thus, a capacitance is created between the capacitor conductor layer 28 and the ground conductor layer 30.

The coil L6 is preferably embedded in the laminate 12a. The coil L6 includes the via hole conductors V8 and V9. The via hole conductors V8 and V9 penetrate the insulator layers 16g and 16h, respectively, in the x-axis direction. As the via hole conductors V8 and V9 are connected to each other, a single via hole conductor is defined. The via hole conductor V9 is connected to the capacitor conductor layer 28. Consequently, the capacitor C3 is connected between a portion between the coil L6 and the outer electrode 14c, and the outer electrode 14d.

The coil L2 is preferably embedded in the laminate 12a. The coil L2 includes the coil conductor layer 24. The coil conductor layer 24 is a linear conductor layer that is provided on the insulator layer 16f and extends in the y-axis direction. The coil conductor layer 18 and the coil conductor layer 24 are opposed to each other with the insulator layer 16e therebetween. In the first preferred embodiment, when seen in plan view from the x-axis direction, the coil conductor layer 18 and the coil conductor layer 24 overlap so as to coincide with each other. The coil conductor layer 24 is preferably defined by, for example, coating of a conductive material such as Cu.

One end of the coil conductor layer 24 is connected to the via conductor layer V6, and the other end of the coil conductor layer 24 is connected to the via hole conductor V8. Consequently, the coil L5 is connected to one end of the coil L2, and the coil L6 is connected to the other end of the coil L2.

While the boundary between the coil L2 and the coil L5 is preferably at the connecting portion between the via hole conductor V6 and the via hole conductor V7 in the electronic component 10a according to the first preferred embodiment, the boundary may alternatively be located at any point along the via hole conductor V6 or the via hole conductor V7. Likewise, while the boundary between the coil L2 and the coil L6 is preferably at the connecting portion between the via hole conductor V8 and the via hole conductor V9, the boundary may alternatively be located at any point along the via hole conductor V8 or the via hole conductor V9.

The electronic component 10a configured as described above makes it possible to prevent deterioration of the out-of-band attenuation characteristics at frequencies higher than a predetermined band. More specifically, the multilayer balance filter 508 described in Japanese Patent No. 4525864 functions as a band pass filter that passes high-frequency signals within a predetermined band. However, the multilayer balance filter 508 has the following problem. That is, because high-frequency signals having frequencies higher than the predetermined band are not removed as a result, the out-of-band attenuation characteristics of the multilayer balance filter 508 at frequencies higher than the predetermined band deteriorate.

Specifically, the mounting surface of the multilayer balance filter 500 is the lower surface of the laminate 508. Therefore, the coil L11 and the capacitor C11 are connected to the circuit board via the outer electrode 509e provided on a side surface of the laminate 508. Consequently, an electric current path defined by the outer electrode 509e extending in the laminating direction is formed between each of the coil L11 and the capacitor C11 and the circuit board. A parasitic inductance is created in such an electric current path. A parasitic inductance blocks high-frequency signals with high frequencies from passing through, so as to block high-frequency signals with frequencies higher than a predetermined band from flowing to the ground side. As a result, high-frequency signals having frequencies higher than the predetermined band are not removed. Consequently, the out-of-band attenuation characteristics of the multilayer balance filter at frequencies higher than the predetermined band deteriorate.

In the electronic component 10a, the ground conductor layer 22 of the capacitor C1 is connected to the outer electrode 14d by extending to the mounting surface S. Consequently, the electric current path between the capacitor C1 and the outer electrode 14d becomes short, so as to reduce the parasitic inductance created between the capacitor C1 and the outer electrode 14d. Therefore, an unbalanced signal (signal Sig1) inputted from the outer electrode 14a and having a frequency higher than the predetermined band flows to the ground side via the outer electrode 14d. As a result, an unbalanced signal (signal Sig1) having a frequency higher than the predetermined band is prevented from passing through the coil L1, so as to prevent balanced signals (signals Sig2 and Sig3) with frequencies higher than the predetermined band from being outputted from the coil L2.

In addition, in the electronic component 10a, the balance characteristics of the balanced signals (signals Sig2 and Sig3) outputted from the outer electrodes 14b and 14c improve. More specifically, in the electronic component 10a, the ground conductor layer 30 is preferably connected to the outer electrode 14d by extending to the mounting surface S. Consequently, the electric current path between each of the capacitors C2 and C3, and the outer electrode 14d becomes short. Consequently, variation between the insertion loss characteristics of the low pass filters LPF1 and LPF2, which results from variation between the length of the electric current path between the capacitor C2 and the outer electrode 14d and the length of the electric current path between the capacitor C3 and the outer electrode 14d, can preferably be prevented from occurring. As a result, it is easy to make the insertion loss characteristics of the low pass filter LPF1 and the insertion loss characteristics of the low pass filter LPF2 closer to each other. Therefore, the balance characteristics of the balanced signals (signals Sig2 and Sig3) outputted from the outer electrodes 14b and 14c improve. Further, owing to the improved balance characteristics, the phase difference between the balanced signals (signals Sig2 and Sig3) becomes closer to 180 degrees.

In the electronic component 10a, the outer electrode 14d is provided between the outer electrodes 14a, 14b, and 14c. Because the outer electrode 14d is grounded, unbalanced and balanced signals are prevented from moving around between the outer electrodes 14a, 14b, and 14c. As a result, the isolation characteristics between the outer electrodes 14a, 14b, and 14c improve.

In the electronic component 10a, the ground conductor layer 22 is provided on the insulator layer 16b. That is, the ground conductor layer 22 is preferably provided on the negative direction side of the x-axis direction with respect to the conductor layers that define the LC parallel resonator LC1, the coil L2, and the low pass filters LPF1 and LPF2, excluding the ground conductor layer 22. In addition, the ground conductor layer 30 is provided on the insulator layer 16i. That is, the ground conductor layer 30 is provided on the positive direction side of the x-axis direction with respect to the conductor layers that form the LC parallel resonator LC1, the coil L2, and the low pass filters LPF1 and LPF2, excluding the ground conductor layer 30. Therefore, the conductor layers defining the LC parallel resonator LC1, the coil L2, and the low pass filters LPF1 and LPF2, excluding the ground conductor layers 22 and 30, are preferably sandwiched by the ground conductor layers 22 and 30 from both sides of the x-axis direction. Consequently, entry of noise into the laminate 12a is prevented, and emission of noise generated inside the laminate 12a to the outside of the laminate 12a is prevented.

In the electronic component 10a, the coils L3 to L6 are preferably defined by the via hole conductors V1 to V9. Increasing the cross-sectional area of a via hole conductor is easier than increasing the cross-sectional area of a conductor layer. Therefore, lowering the resistance value of a via hole conductor is easier than lowering the resistance value of a conductor layer. For this reason, the resistance values of the coils L3 to L6 can be lowered more easily than those of coils that are all defined by conductor layers. As a result, the Q-factors of the coils L3 to L6 improve.

In the electronic component 10a, the coil conductor layers 18 and 24 are electromagnetically coupled to each other in the vicinity of the center in the x-axis direction of the laminate 12a. Further, the capacitor conductor layers 20, 26, and 28 and the ground conductor layers 22 and 30 are provided near both ends in the x-axis direction of the laminate 12a. That is, the coil conductor layers 18 and 24, and the capacitor conductor layers 20, 26, and 28 and the ground conductor layers 22 and 30 are spaced apart from each other. Therefore, when a signal flows, the electromagnetic field generated in the coil conductor layers 18 and 24 is preferably not blocked by the capacitor conductor layers 20, 26, and 28 and the ground conductor layers 22 and 30. Consequently, strong electromagnetic coupling is obtained between the coil L1 and the coil L2, and favorable balance characteristics can be obtained.

Further, in the electronic component 10a, each of the coils L3 to L6 is defined solely by a via hole conductor. Therefore, when a signal flows, the electromagnetic field generated in the coils L3 to L6 and the electromagnetic field generated in the coils L1 and L2 are orthogonal to each other. Consequently, the electromagnetic field generated in the coils L1 and L2 is not interfered with by the electromagnetic field generated in the coils L3 to L6. Consequently, strong electromagnetic coupling is obtained between the coil L1 and the coil L2, and favorable balance characteristics can be obtained.

Figure 4:
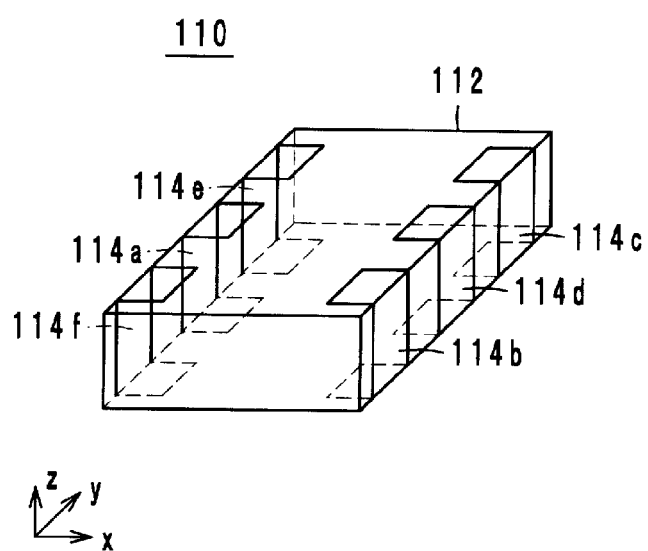
FIG. 4 is a perspective view of the outward appearance of an electronic component according to a comparative example.
Figure 5:
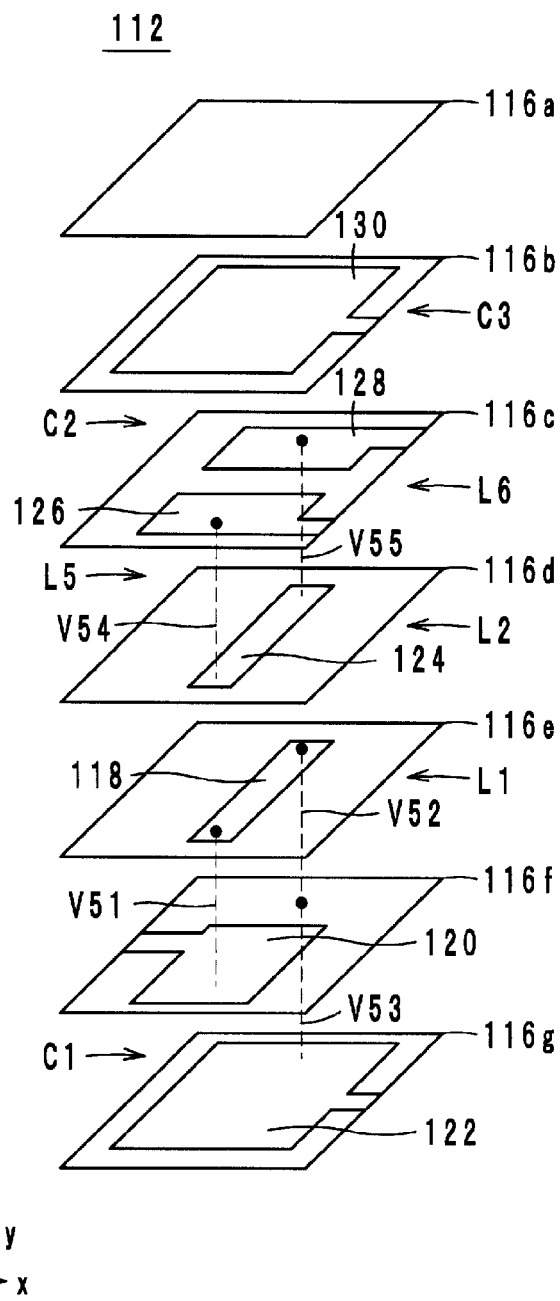
FIG. 5 is an exploded perspective view of a laminate of an electronic component according to a preferred embodiment of the present invention.

A computer simulation which is described below has been conducted in order to further clarify the advantageous effects of the electronic component 10a in accordance with the first preferred embodiment of the present invention. FIG. 4 is a perspective view of the outward appearance of an electronic component 110 according to a comparative example. FIG. 5 is an exploded perspective view of a laminate 112 of the electronic component 110.

The electronic component 110 preferably includes the same circuit configuration as the electronic component 10a. That is, the electronic component 110 preferably includes outer electrodes 114a to 114f, insulator layers 116a to 116g, coil conductor layers 118 and 124, capacitor conductor layers 120, 126, and 128, ground conductor layers 122 and 130, and hole conductors V51 to V55.

The electronic component 110 includes a mounting surface at the lower side of the laminating direction (the negative direction side of the z-axis direction). The respective transmission and reflection characteristics of the electronic component 10a illustrated in FIGS. 2 and 3 and electronic component 110 illustrated in FIGS. 4 and 5 have been investigated. A transmission characteristic represents the relationship in differential mode between frequency and the attenuation of the signal Sig2 or Sig3 outputted from the output port (outer electrode 14b, 14c, 114b, or 114c) with respect to the signal Sig1 inputted from the input port (outer electrode 14a or 114a). A reflection characteristic represents the relationship between frequency and the attenuation of the signal outputted from the input port (outer electrode 14a or 114a) with respect to the signal Sig1 inputted from the input port (outer electrode 14a or 114a).

Figure 6:
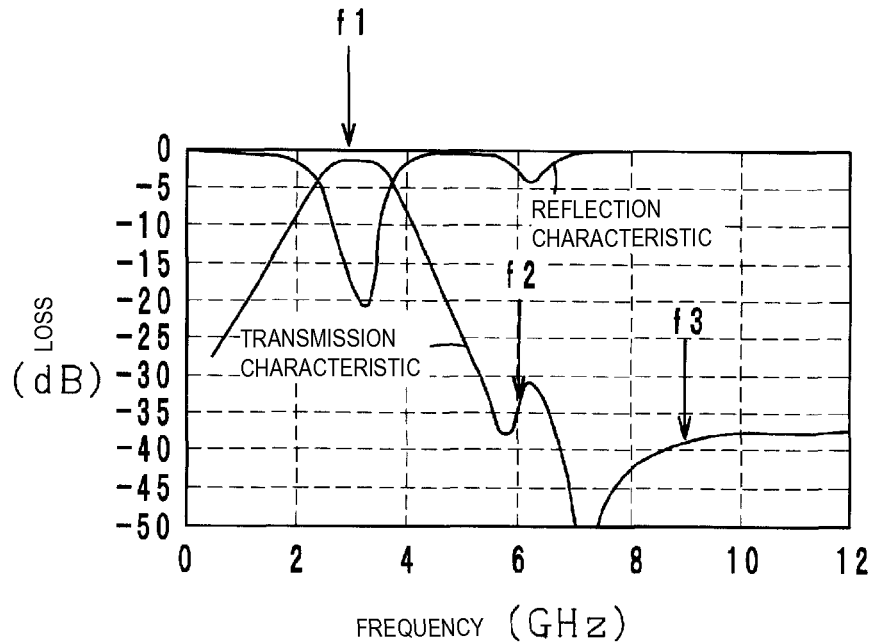
FIG. 6 is a graph illustrating the transmission and reflection characteristics of an electronic component according to a preferred embodiment of the present invention.
Figure 7:
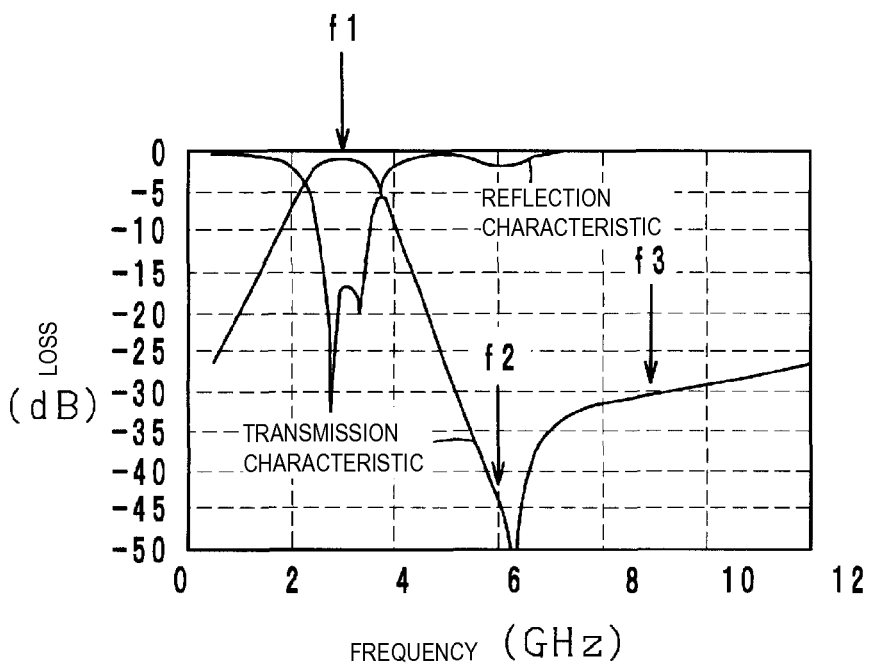
FIG. 7 is a graph illustrating the transmission and reflection characteristics of an electronic component according to a preferred embodiment of the present invention.

FIG. 6 is a graph illustrating the transmission and reflection characteristics of the electronic component 10a. FIG. 7 is a graph illustrating the transmission and reflection characteristics of the electronic component 110. The vertical axis represents loss, and the horizontal axis represents frequency. A frequency f1 indicates the center frequency of the pass band of each of the electronic components 10a and 110 that are band pass filters. Frequencies f2 and f3 indicate the frequencies of the second and third harmonics, respectively, of a signal with the frequency f1.

According to FIGS. 6 and 7, it is appreciated that the loss of the transmission characteristic is greater in the electronic component 10a than in the electronic component 110 at the frequency f3 of the third harmonic. That is, it is appreciated that in the electronic component 10a, the third harmonic is unlikely to be outputted from each of the outer electrodes 14b and 14c. Therefore, according to the simulation, it is appreciated that in the electronic component 10a, unnecessary signals with frequencies higher than a predetermined band are prevented from being outputted from the coil L2.

Figure 8:
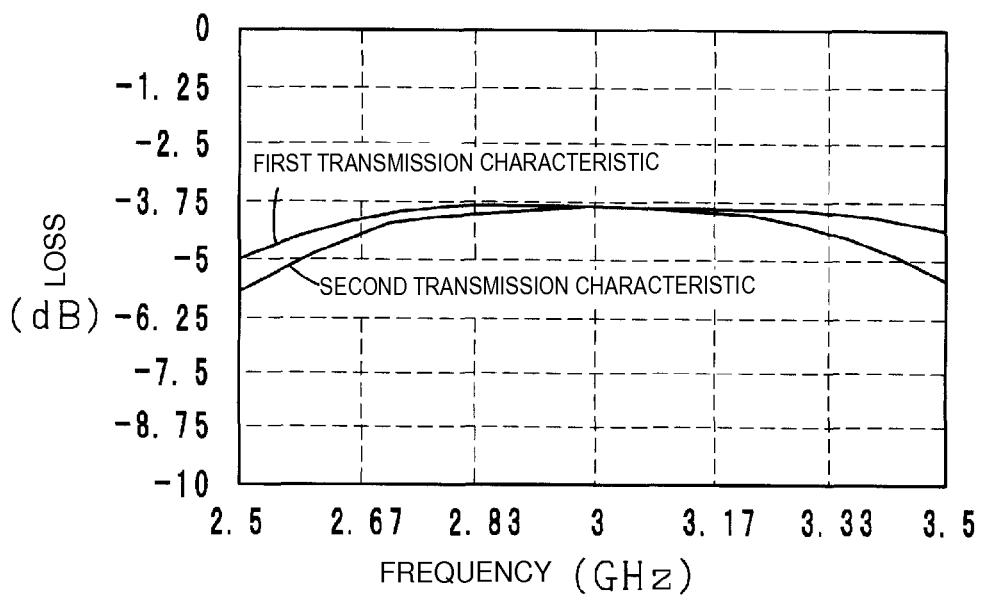
FIG. 8 is a graph illustrating first and second transmission characteristics of an electronic component according to a preferred embodiment of the present invention.
Figure 9:
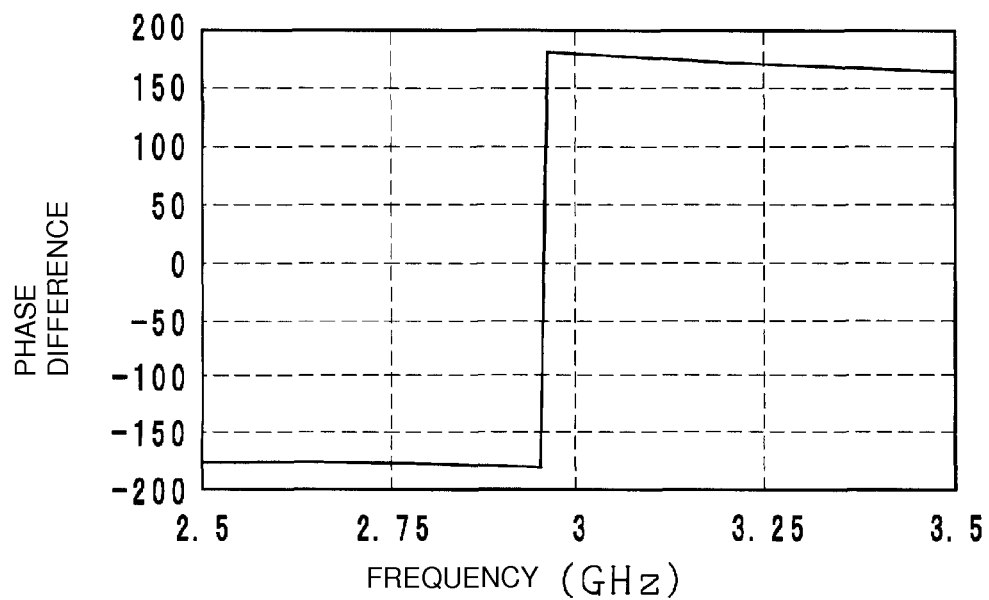
FIG. 9 is a graph illustrating the relationship between the phase difference of balanced signals and frequency according to a preferred embodiment of the present invention.

FIG. 8 is a graph illustrating first and second transmission characteristics of the electronic component 10a. The vertical axis represents loss, and the horizontal axis represents frequency. The first transmission characteristic represents the relationship between frequency and the attenuation of the signal Sig2 outputted from the output port (outer electrode 14b) with respect to the signal Sig1 inputted from the input port (outer electrode 14a). The second transmission characteristic represents the relationship between frequency and the attenuation of the signal Sig3 outputted from the output port (outer electrode 14c) with respect to the signal Sig1 inputted from the input port (outer electrode 14a). FIG. 9 is a graph illustrating the relationship between the phase difference of balanced signals (signals Sig2 and Sig3) and frequency. The vertical axis represents phase difference, and the horizontal axis represents frequency.

According to FIG. 8, the first transmission characteristic and the second transmission characteristic are substantially the same. Further, according to FIG. 9, it is appreciated that the phase difference of the balanced signals is substantially constant at 180 degrees even when the frequency changes. Therefore, according to the simulation, it is appreciated that the electronic component 10a has excellent balance characteristics.

Second Preferred Embodiment

Figure 10:
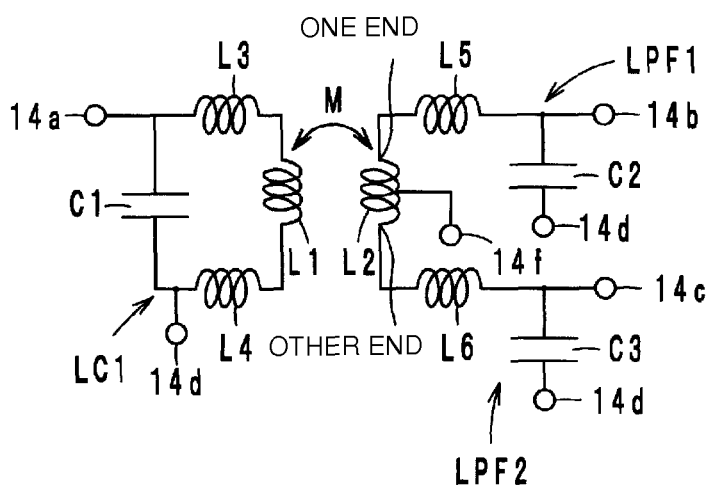
FIG. 10 is an equivalent circuit diagram of an electronic component according to a preferred embodiment of the present invention.
Figure 11:
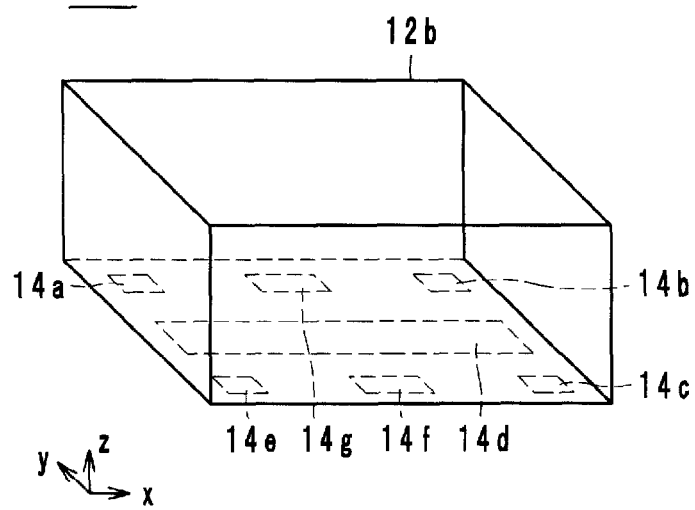
FIG. 11 is a perspective view of the outward appearance of the electronic component illustrated in FIG. 10.
Figure 12:
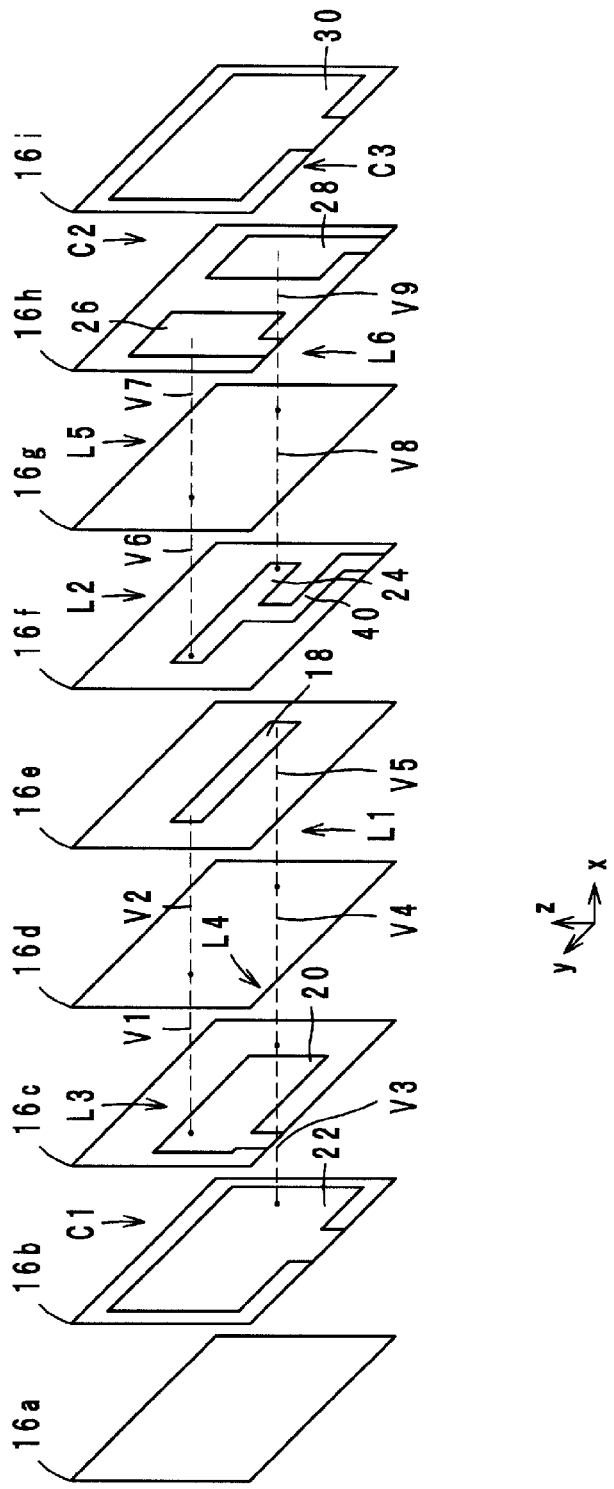
FIG. 12 is an exploded perspective view of a laminate of the electronic component illustrated in FIG. 11.

Hereinafter, the circuit configuration of an electronic component according to a second preferred embodiment of the present invention will be described with reference to the drawings. FIG. 10 is an equivalent circuit diagram of an electronic component 10b according to the second preferred embodiment. FIG. 11 is a perspective view of the outward appearance of the electronic component 10b illustrated in FIG. 10. FIG. 12 is an exploded perspective view of a laminate 12b of the electronic component 10b illustrated in FIG. 11.

As illustrated in FIG. 10, the electronic component 10b preferably differs from the electronic component 10a in that the coil L2 is connected to an outer electrode 14f. A bias voltage to be supplied to an IC connected to each of the outer electrodes 14b and 14c is applied to the outer electrode 14f. Accordingly, as illustrated in FIG. 11, the electronic component 10b preferably further includes the outer electrode 14f and an outer electrode 14g. The outer electrode 14g is a floating outer electrode that is not connected to an internal circuit. As illustrated in FIG. 12, the coil conductor layer 24 is preferably connected to the outer electrode 14f via a connection conductor layer 40.

The electronic component 10b described above also provides the same operational effects as those of the electronic component 10a.

Third Preferred Embodiment

Figure 13:
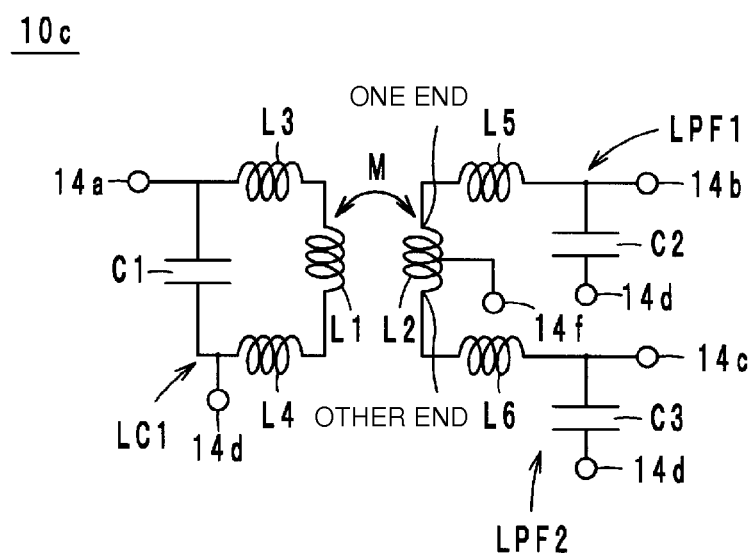
FIG. 13 is an equivalent circuit diagram of an electronic component according to a preferred embodiment of the present invention.
Figure 14:
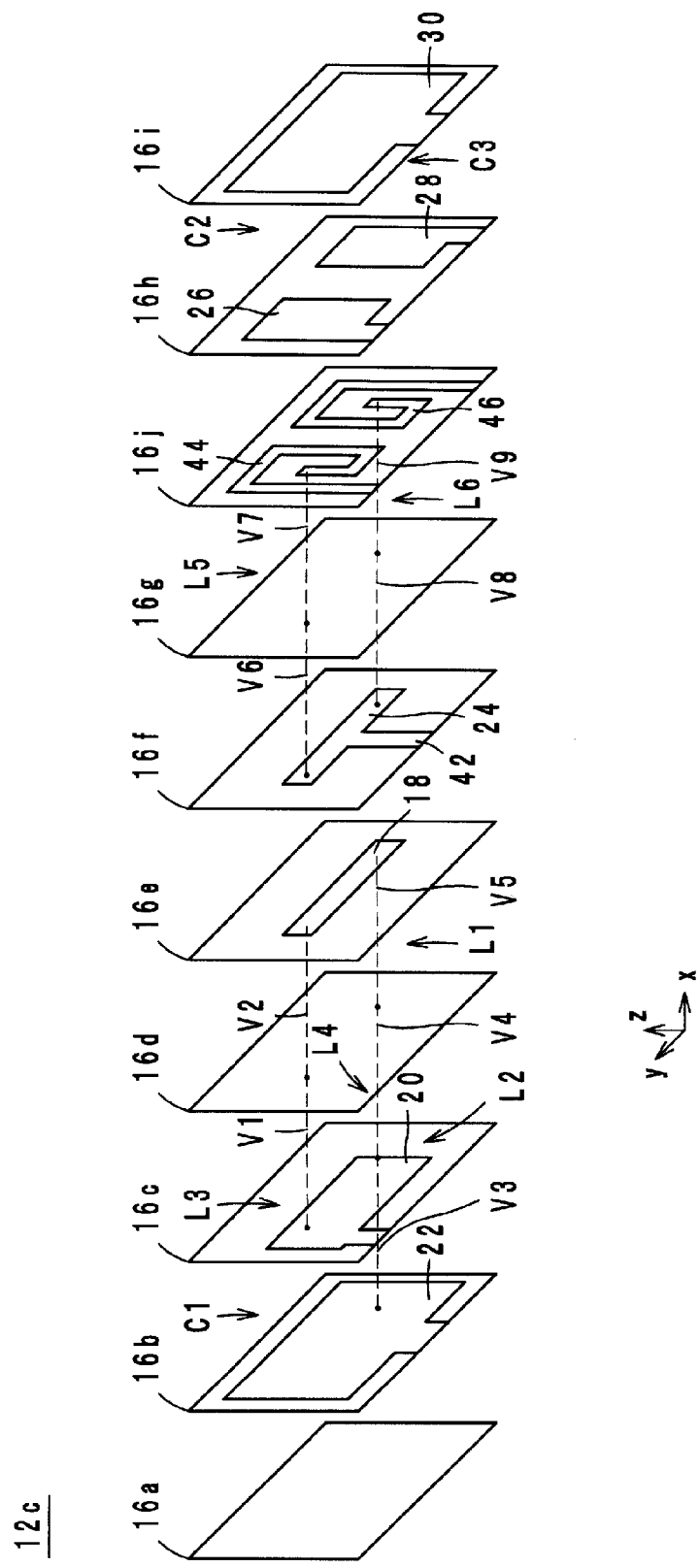
FIG. 14 is an exploded perspective view of a laminate of the electronic component illustrated in FIG. 13.
Figure 15:
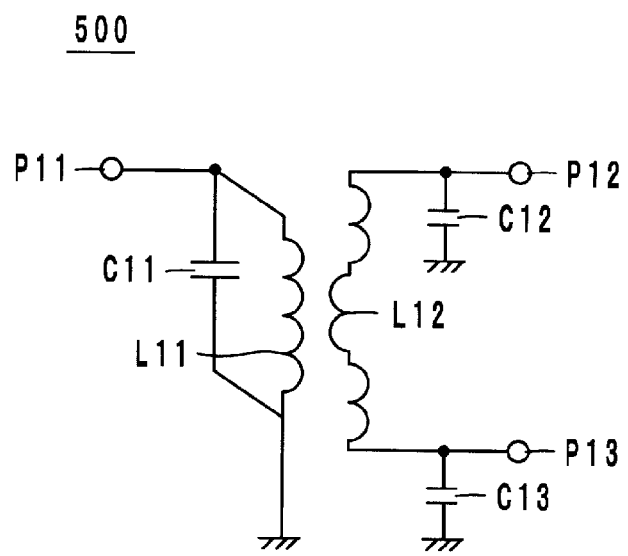
FIG. 15 is an equivalent circuit diagram of a multilayer balance filter described in Japanese Patent No. 4525864.
Figure 16:
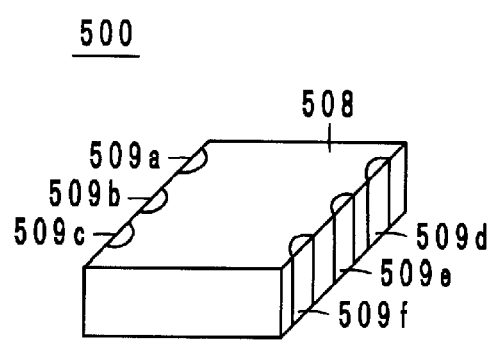
FIG. 16 is a perspective view of the outward appearance of the multilayer balance filter described in Japanese Patent No. 4525864.
Figure 17:
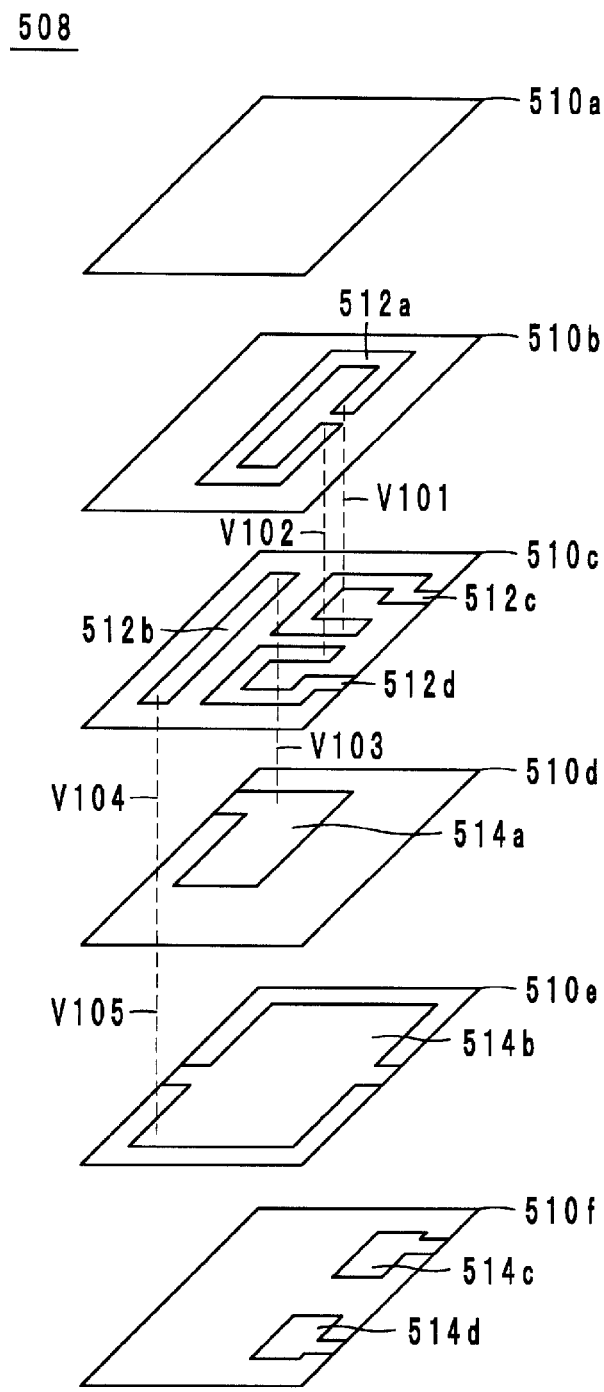
FIG. 17 is an exploded perspective view of the multilayer balance filter described in Japanese Patent No. 4525864.

Hereinafter, the circuit configuration of an electronic component according to a third preferred embodiment of the present invention will be described with reference to the drawings. FIG. 13 is an equivalent circuit diagram of an electronic component 10c according to the third preferred embodiment. FIG. 14 is an exploded perspective view of a laminate 12c of the electronic component 10c illustrated in FIG. 13. As for a perspective view of the outward appearance of the electronic component 10c, FIG. 2 is used.

As illustrated in FIG. 13, the electronic component 10c preferably differs from the electronic component 10a in that the coil L2 is connected to the outer electrode 14f. The outer electrode 14f is grounded.

The electronic component 10c preferably further includes an insulator layer 16j, and coil conductor layers 44 and 46. The insulator layer 16j is preferably inserted between the insulator layers 16g and 16h. The coil conductor layer 44 preferably is provided on the insulator layer 16j. The coil conductor layer 44 is a conductor layer with a spiral shape that runs from the center toward the outer periphery while swirling around counterclockwise when viewed along the x-axis from the positive direction to the negative direction. One end of the coil conductor layer 44 is connected to the via hole conductor V7, and the other end of the coil conductor layer 44 is connected to the outer electrode 14b. Consequently, the coil conductor layer 44 defines a portion of the coil L5. The coil conductor layer is provided on the insulator layer 16j. The coil conductor layer 46 is preferably a conductor layer with a spiral shape that runs from the center toward the outer periphery while swirling around counterclockwise when viewed along the x-axis from the positive direction to the negative direction. One end of the coil conductor layer 46 is connected to the via hole conductor V9, and the other end of the coil conductor layer 46 is connected to the outer electrode 14c. Consequently, the coil conductor layer 46 preferably defines a portion of the coil L6.

The electronic component 10c described above also provides the same operational effects as those of the electronic component 10a.

Further, the electronic component 10c is provided with the outer electrode 14f. Therefore, the coil L2 is grounded, and has a reference potential. As illustrated in FIG. 14, the coil conductor layer 24 is preferably connected to the outer electrode 14f via a connection conductor layer 42. Since the balanced signals (signals Sig1 and Sig2) outputted from the outer electrodes 14b and 14c are preferably referenced with respect to this reference potential of the coil L2, the balance of balanced signals outputted form the electronic component 10c improves.

The electronic component 10c may alternatively be provided with a plurality of coil conductor layers 44 and 46. Consequently, it is possible to increase the inductance value of each of the coils L5 and L6.

In the electronic component 10, the outer electrode 14b may be divided into a portion to which the ground conductor layer 22 is connected, and a portion to which the ground conductor layer 30 is connected.

Further, the ground conductor layer 30 may alternatively be divided into a portion to which the capacitor conductor layer 26 is opposed, and a portion to which the capacitor conductor layer 28 is opposed. Moreover, the outer electrode 14b may alternatively be divided into a portion connected to the portion of the ground conductor layer 30 to which the capacitor conductor layer 26 is opposed, and a portion connected to the portion of the ground conductor layer 30 to which the capacitor conductor layer 28 is opposed. As described above, the preferred embodiments of the present invention are useful for an electronic component. In particular, preferred embodiments of the present invention are advantageous in that they prevent deterioration of the out-of-band attenuation characteristics at frequencies higher than a predetermined band.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
    a laminate that includes a plurality of insulator layers that are laminated, the laminate including a mounting surface configured to be disposed closest to and extend in parallel with a surface of a board on which the laminate is mounted so as to electrically connect the electrical component with the board, the mounting surface being defined by outer edges of the plurality of insulator layers that are continuously joined together;
    an LC parallel resonator to which an unbalanced signal is inputted, the LC parallel resonator being embedded in the laminate and including a first coil and a first capacitor;
    a second coil that is embedded in the laminate, the second coil being electromagnetically coupled to the first coil and outputting balanced signals; and
    a first outer electrode which is provided on the mounting surface, and which is grounded; wherein
    a ground conductor layer of the first capacitor is connected to the first outer electrode by extending to the mounting surface; and
    the first coil includes:
        a first coil conductor layer that is provided on one of the plurality of insulator layers;
        a first via hole conductor that is connected to one end of the first coil conductor layer; and
        a second via hole conductor that is connected to another end of the first coil conductor layer.

2. The electronic component according to claim 1, wherein the first outer electrode has a cross shape.

3. The electronic component according to claim 2, wherein a plurality of additional outer electrodes are arranged such that the first outer electrode is between the plurality of additional outer electrodes.

4. The electronic component according to claim 3, wherein the plurality of additional outer electrodes each have a rectangular or substantially rectangular shape.

5. The electronic component according to claim 1, wherein the first outer electrode includes a first straight-line portion and a second straight-line portion, the first straight-line portion and the second straight-line portion cross each other at an intersection of diagonals of the mounting surface.

6. The electronic component according to claim 1, further comprising:
    a second outer electrode that is connected to the LC parallel resonator, and to which the unbalanced signal is inputted;

a third outer electrode and a fourth outer electrode that are respectively connected to opposite ends of the second coil, and from which the balanced signals are outputted;
a first low pass filter that is embedded in the laminate, the first low pass filter being connected between one end of the second coil and the third outer electrode; and
a second low pass filter that is embedded in the laminate, the second low pass filter being connected between another end of the second coil and the fourth outer electrode.

7. The electronic component according to claim 1, wherein:
the second coil includes:
a second coil conductor layer that is provided on the plurality of insulator layers;
a third via conductor that is connected to one end of the second coil conductor layer; and
a fourth via hole conductor that is connected to another end of the second coil conductor layer; and
the first coil conductor layer and the second coil conductor layer are opposed to each other with one of the plurality of insulator layers disposed between the first coil conductor layer and the second coil conductor layer.

8. The electronic component according to claim 1, wherein:
the electronic component further comprises a second outer electrode to which a bias voltage is applied; and
the second coil is connected to the second outer electrode.

9. The electronic component according to claim 1, wherein:
the electronic component further comprises a second outer electrode that is grounded; and
the second coil is connected to the second outer electrode.

10. The electronic component according to claim 6, wherein the first outer electrode includes a first straight-line portion and a second straight-line portion, the first straight-line portion and the second straight-line portion cross each other at an intersection of diagonals of the mounting surface.

11. The electronic component according to claim 10, wherein:
the electronic component further comprises a fifth outer electrode and a sixth outer electrode that are provided on the mounting surface, and are grounded;
the first low pass filter includes:
a third coil that is connected between the one end of the second coil and the third outer electrode; and
a second capacitor that is connected between a portion between one end of the third coil and the third outer electrode, and the fifth outer electrode;
the second low pass filter includes:
a fourth coil that is connected between the other end of the second coil and the fourth outer electrode; and
a third capacitor that is connected between a portion between the fourth coil and the fourth outer electrode, and the sixth outer electrode; and
ground conductor layers of the second capacitor and the third capacitor are connected to the fifth outer electrode and the sixth outer electrode, respectively, by extending to the mounting surface.

12. The electronic component according to claim 11, wherein:
the electronic component further comprises a seventh outer electrode that is grounded; and
the second coil is connected to the seventh outer electrode.

13. The electronic component according to claim 12, wherein the second through seventh outer electrodes are arranged such that the first outer electrode is between the second through seventh outer electrodes.

14. The electronic component according to claim 11, wherein:
the ground conductor layer of the first capacitor is provided on one side of a laminating direction with respect to conductor layers that define the LC parallel resonator, the second coil, the first low pass filter, and the second low pass filter, excluding the ground conductor layer; and
the ground conductor layers of the second capacitor and the third capacitor are provided on another side of the laminating direction with respect to the conductor layers that define the LC parallel resonator, the second coil, the first low pass filter, and the second low pass filter, excluding the ground conductor layers.

15. The electronic component according to claim 11, wherein:
the electronic component further comprises a seventh outer electrode to which a bias voltage is applied; and
the second coil is connected to the seventh outer electrode.

16. The electronic component according to claim 15, wherein the second through seventh outer electrodes are arranged such that the first outer electrode is between the second through seventh outer electrodes.

17. The electronic component according to claim 10, wherein the first outer electrode has a cross shape.

18. The electronic component according to claim 17, wherein the second through fourth outer electrodes are arranged such that the first outer electrode is between the second through fourth outer electrodes.

19. The electronic component according to claim 17, wherein the second through fourth outer electrodes each have a rectangular or substantially rectangular shape.

* * * * *